(12) United States Patent
Lee et al.

(10) Patent No.: US 10,181,431 B2
(45) Date of Patent: Jan. 15, 2019

(54) PACKAGE SUBSTRATE AND METHOD OF MANUFACTURING THE SAME

(71) Applicant: Samsung Electro-Mechanics Co., Ltd., Suwon-si (KR)

(72) Inventors: Dong-Uk Lee, Cheongju-si (KR); Young-Gon Kim, Ulsan (KR); Jin-Young Yoon, Cheongju-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 39 days.

(21) Appl. No.: 15/088,666

(22) Filed: Apr. 1, 2016

(65) Prior Publication Data

US 2016/0353568 A1  Dec. 1, 2016

(30) Foreign Application Priority Data

May 29, 2015 (KR) ........................ 10-2015-0076481

(51) Int. Cl.

| | |
|---|---|
| *H05K 1/11* | (2006.01) |
| *H05K 1/14* | (2006.01) |
| *H01L 23/13* | (2006.01) |
| *H05K 3/10* | (2006.01) |
| *H05K 3/20* | (2006.01) |
| *H05K 3/40* | (2006.01) |
| *H05K 1/02* | (2006.01) |
| *H05K 3/06* | (2006.01) |

(52) U.S. Cl.
CPC .............. *H01L 23/13* (2013.01); *H05K 1/115* (2013.01); *H05K 3/108* (2013.01); *H05K 3/205* (2013.01); *H05K 3/4007* (2013.01); *H05K 1/0298* (2013.01); *H05K 1/14* (2013.01); *H05K 3/06* (2013.01); *H05K 2201/0376* (2013.01); *H05K 2201/09509* (2013.01)

(58) Field of Classification Search
CPC ...... H01L 23/13; H05K 3/108; H05K 3/4007; H05K 3/205; H05K 3/06; H05K 2201/09509; H05K 2201/0376
See application file for complete search history.

(56) References Cited

U.S. PATENT DOCUMENTS 8,209,860 B2   7/2012 An et al.
9,210,808 B2 * 12/2015 Kaneko .................. H05K 1/113
(Continued)

*Primary Examiner* — Ishwarbhai B Patel
(74) *Attorney, Agent, or Firm* — NSIP Law

(57) ABSTRACT

Package substrate and a method of manufacturing the same is disclosed. The package substrate includes an insulating layer having first circuit patterns embedded in a first surface of the insulating layer, and a protruded circuit pattern formed above at least one of the embedded first circuit patterns, wherein a width of the protruded circuit pattern is greater than a width of each of the embedded first circuit patterns. Accordingly, a flip chip and a wire bonding chip may be installed at the same time owing to an embedded structure of circuit pattern and a protruded structure of circuit pattern realized together on a surface where an electronic component is to be installed. Moreover, a fine circuit pattern may be formed, and a surface treatment layer may be selectively formed at desired portions without forming an additional seed layer for electroplating, thereby possibly simplifying manufacturing processes and saving manufacturing costs.

10 Claims, 9 Drawing Sheets

(56) References Cited

U.S. PATENT DOCUMENTS

| | | | | |
|---|---|---|---|---|
| 2013/0075145 A1* | 3/2013 | Kaneko | H05K 1/113 | |
| | | | 174/262 | |
| 2014/0332253 A1* | 11/2014 | Lin | H05K 3/0097 | |
| | | | 174/251 | |
| 2015/0144384 A1* | 5/2015 | Ho | H01L 24/16 | |
| | | | 174/257 | |
| 2016/0143149 A1* | 5/2016 | Su | H05K 1/188 | |
| | | | 174/251 | |

* cited by examiner

PACKAGE SUBSTRATE AND METHOD OF MANUFACTURING THE SAME

CROSS-REFERENCE TO RELATED APPLICATION(S)

This application claims the benefit under 35 USC § 119(a) of Korean Patent Application No. 10-2015-0076481, filed with the Korean Intellectual Property Office on May 29, 2015, the entire disclosure of which is incorporated herein by reference for all purposes.

BACKGROUND

1. Field

The following description relates to a package substrate and a method of manufacturing a package substrate.

2. Description of Related Art

With the advancement of the electronics industry, the performance of the electronic components have improved while the size of the devices have decreased, requiring semiconductor packages to be smaller and to have higher densities.

The packages have higher densities because there are more input/output connection terminals due to an increased number of IC chips being installed. As a result, finer pitches are required together with higher densities.

For today's high density packages, the IC chips are installed using the wire bonding method and the flip bonding method, which is desired due to the installation costs when there are a large number of input/output connection terminals. Moreover, the hybrid flip bonding method, in which a flip chip and a wire bonding chip are installed together, is also used.

For instance, in U.S. Pat. No. 8,209,860 describes a printed circuit board having a metal bump and a method of manufacturing the printed circuit board. Metal bumps are formed in a post shape with uniform height and excellent electrical conductivity since the metal bumps are formed using a dry film laminated above a carrier. The metal bumps also have uniform diameter since the metal bumps are formed by plating holes, having uniform diameter, patterned in the dry film, thereby forming the metal bumps having fine pitch. All documents cited in the present disclosure, including published documents, patent applications, patents, and U.S. Pat. No. 8,209,860 may be incorporated herein in their entirety by reference in the same manner as when each cited document is separately and specifically incorporated or incorporated in its entirety

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

in a general aspect there is provided a package substrate in which a flip chip and a wire bonding chip may be installed at the same time by realizing an embedded structure of circuit pattern and a protruded structure of circuit pattern together on a surface where an electronic component is to be installed, in which a fine circuit pattern may be formed, and in which a surface treatment layer may be selectively formed at desired portions without forming an additional seed layer for electroplating, thereby possibly simplifying manufacturing processes and saving manufacturing costs thereof.

In another general aspect there is provided a method of manufacturing a package substrate in which a flip chip and a wire bonding chip may be installed at the same time by realizing an embedded structure of circuit pattern and a protruded structure of circuit pattern together on a surface where an electronic component is to be installed, in which a fine circuit pattern may be formed, and in which a surface treatment layer may be selectively formed at desired portions without forming an additional seed layer for electroplating, thereby possibly simplifying manufacturing processes and saving manufacturing costs thereof.

In another general aspect there is provided an insulating layer having first circuit patterns embedded in a first surface, and a protruded circuit pattern formed above at least one of the embedded first circuit patterns, wherein a width of the protruded circuit pattern is greater than a width of each of the embedded first circuit patterns.

The package substrate may include a surface treatment layer formed above the protruded circuit pattern.

A surface of the each of the embedded first circuit patterns may be formed on a same plane as the first surface of the insulating layer.

The package substrate may include a second circuit pattern formed on a second surface of the insulating layer.

The package substrate may include a via to electrically connect the first circuit patterns with the second circuit pattern.

The package substrate may include a solder resist layer covering a portion of the first circuit patterns, a portion of the first surface of the insulating layer, a portion of the second circuit pattern, and a portion of the second surface of the insulating layer.

The second surface of the insulating layer may be disposed opposite to the first surface of the insulating layer.

A surface of the protruded circuit pattern may be disposed parallel to and above the first surface.

A surface of the surface treatment layer may include a first layer electroplated on a second layer.

In another general aspect there is provided a method of manufacturing a package substrate, including preparing a carrier substrate having a first seed layer laminated thereon, forming first circuit layers on the first seed layer, laminating an insulating layer to embed the first circuit layers, separating the carrier substrate and the first seed layer from each other, and partially removing the first seed layer to expose the first circuit patterns embedded in the insulating layer and to form a protruded circuit pattern above at least one of the embedded first circuit patterns, wherein the protruded circuit pattern is wider than each of the embedded first circuit patterns.

A surface of the each of the embedded first circuit patterns may be formed on a same plane as a surface of the insulating layer.

The method may include masking using a plating resist to expose portions of a surface of the first seed layer that are to be surface-treated, electroplating to form a surface treatment layer on the exposed surface of the first seed layer, and removing the plating resist, wherein the partially removing of the first seed layer comprises removing portions of the first seed layer where the surface treatment layer is not formed.

The first seed layer may be used as the seed layer for electroplating.

The method may include removing portions of the insulating layer to expose portions of the first circuit layers, forming a second seed layer on a second surface of the insulating layer and at the portions of the insulating layer where the first circuit layers are exposed, and electroplating to form a second circuit layer using the second seed layer, the second circuit layer comprising a via to electrically connect with portions of the first circuit layer.

The method may include removing a portion of the second seed layer to form a second circuit pattern.

The method may include forming a solder resist layer to cover a portion of the first circuit patterns, a portion of the surface of the insulating layer, a portion of the second circuit pattern, and a portion of the second surface of the insulating layer.

In another general aspect there is provided a method of manufacturing a package substrate, including preparing a carrier substrate having seed layers laminated on two opposing surfaces of the carrier substrate, forming first circuit layers on a first seed layer of the seed layers laminated on the carrier substrate, embedding the first circuit layers in an insulating layer and partially removing the insulating layer to expose a portion of the first circuit layers, forming a second seed layer on a surface of the insulating layer distal from the first circuit layers and on the exposed a portion of the first circuit layers, forming second circuit layers on the second seed layer, and separating the carrier substrate and the first seed layer from each other.

The forming of the first circuit layers may include electroplating the first seed layer to form the layers first circuit patterns, forming an etching resist on a portion of the first circuit layers to partially remove the first seed layer, and etching the first seed layer to expose the first circuit patterns embedded in the insulating layer and to form a protruded circuit pattern above at least one of the embedded first circuit patterns.

The forming of the second circuit layers include electroplating the second seed layer to form the second circuit layers, the second circuit layers comprising a via, forming an etching resist on the second circuit layers to partially remove the second seed layer, and etching the second seed layer.

The carrier substrate may include an insulating material having copper foil laminated on two opposing surfaces of the insulating material, and the seed layers and the copper foil layer may be separable from each other.

The package substrate further includes a surface treatment layer formed above the protruded circuit pattern, and surfaces of the embedded first circuit patterns are formed on a same plane as a surface of the insulating layer.

In the package substrate, owing to an embedded structure of circuit pattern and a protruded structure of circuit pattern realized together on a surface where an electronic component is to be installed, a flip chip and a wire bonding chip may be installed at the same time, and a fine circuit pattern may be formed.

According to a method of manufacturing a package substrate in accordance with an embodiment, a seed layer on a side of embedded circuit patterns is utilized to form a surface treatment layer above protruded circuit pattern, which needs to be surface-treated, without forming an additional seed layer for electroplating or an additional plating lead-in wire, and thus the processes used for the method of manufacturing a package substrate may be simpler and more economical than the conventional tailless method.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
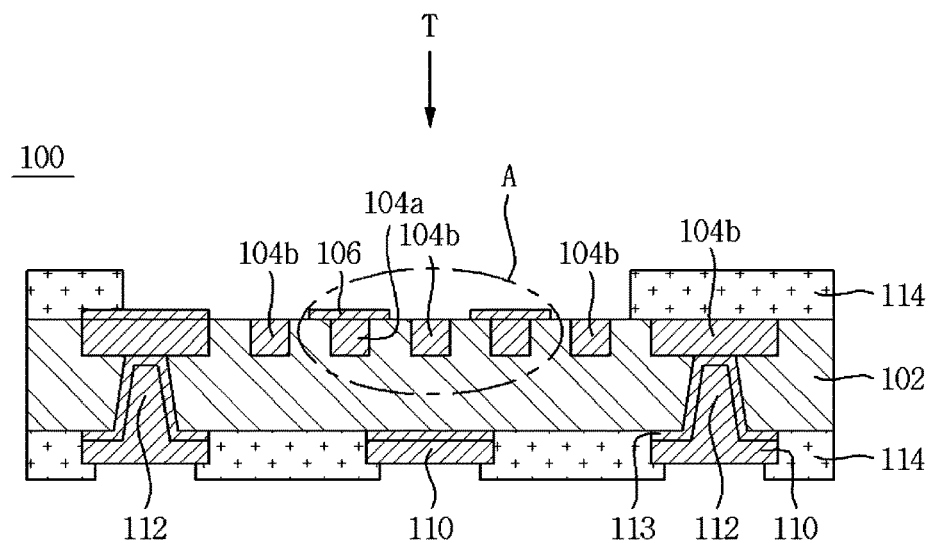
FIG. 1 is a diagram illustrating an example of a package substrate.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Identical or corresponding elements will be given the same reference numerals, regardless of the figure number, and any redundant description of the identical or corresponding elements will not be repeated. Throughout the description of the present disclosure, when describing a certain relevant conventional technology is determined to evade the point of the present disclosure, the pertinent detailed description will be omitted. Terms such as "first" and "second" can be used in describing various elements, but the above elements shall not be restricted to the above terms. The above terms are used only to distinguish one element from the other. In the accompanying drawings, some elements may be exaggerated, omitted or briefly illustrated, and the dimensions of the elements do not necessarily reflect the actual dimensions of these elements.

FIG. 1 is a diagram illustrating an example of a package substrate in accordance with a first embodiment.

Referring to FIG. 1, a package substrate 100 includes an insulating layer 102 having first circuit patterns 104a, 104b embedded in one surface thereof and a protruded circuit pattern 106 protruded above a certain circuit pattern, such as, for example, 104a, of the embedded first circuit patterns 104a, 104b.

The package substrate 100 includes a second circuit pattern 110 formed on the other surface of the insulating layer 102. The package substrate 100 also includes a via 112 to electrically connect the first circuit patterns 104a and 104b, a solder resist layer covering a portion of the first circuit patterns 104a and 104b and a portion of an upper surface of the insulating layer 102 and covering a portion of the second circuit pattern 110 and a portion of a lower surface of the insulating layer 102. Reference numeral 113 is a seed layer that is used for forming the via 112 and the second circuit pattern 110.

It is illustrated in FIG. 1 that the package substrate 100 includes two layers of circuit patterns, the first circuit patterns 104a, 104b embedded in an upper surface and the second circuit pattern 110 formed below the insulating layer 102, this is only an example, and the package substrate in accordance with an example may possibly include various numbers of insulating layers and various numbers of embedded circuit patterns.

The insulating layer 102 may be made of a general resin insulating material. In an example, the insulating layer 102 may be made of a thermosetting resin such as an epoxy resin, or a thermoplastic resin such as polyimide. The resin used for forming the insulating layer 102 may further include a stiffener such as glass fiber or may be impregnated with an inorganic filler. For instance, the insulating layer 102 may be made of a prepreg or an ajinomoto build-up film (ABF), but the material for forming the insulating layer 102 is not restricted to what is described herein.

Moreover, the first circuit patterns 104a and 104b and the second circuit pattern 110 may be made of any circuit-forming conductive metal used in the field of circuit board. For example, the first circuit patterns 104a, 104b and the second circuit pattern 110 may be made of copper, but the material for forming the circuit patterns is not restricted to what is described herein.

The solder resist layer 114, which protects a circuit on an outermost layer, is formed for electrical insulation using material, such as, for example, solder resist ink or solder resist film. In another example, the solder resist layer 114 may be made of an insulating material such as a thermosetting resin or a thermoplastic resin, depending on its purpose, but the material for forming the solder resist layer 114 is not restricted to what is described herein.

As illustrated in FIG. 1, since the package substrate 100 includes both the first circuit patterns 104a and 104b embedded in a surface on which an electronic component (not shown) is to be installed and the protruded circuit pattern 106, which protrudes on the surface on which an electronic component (not shown) is to be installed, it is possible to install a flip chip and a wire bonding chip together.

In the package substrate 100 illustrated in FIG. 1, the embedded first circuit pattern 104b having no protruded circuit pattern formed thereon is used as a signal line and forms a region where fine circuits are concentrated.

Surfaces of the embedded first circuit patterns 104a and 104b are formed on a same plane as a surface of the insulating layer 102. The protruded circuit pattern 106 protrudes above the first circuit pattern 104a by about 10 μm or less. Thus, a top surface of the protruded circuit pattern 106 is at a different plane than the plane of a top surface of the insulating layer 102.

Figure 2:
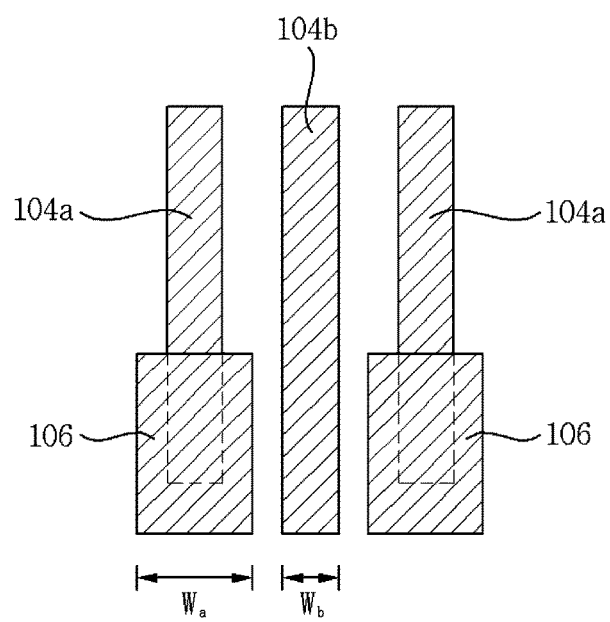
FIG. 2 is a diagram illustrating an example of a section marked "A" of the package substrate shown in FIG. 1 seen from the top (T) in order to compare widths of an embedded circuit pattern and a protruded circuit pattern.

Referring to FIG. 2, a width $W_a$ of the protruded circuit pattern 106 is greater than a width $W_b$ of each of the embedded first circuit patterns 104a and 104b.

The protruded circuit pattern 106 is used as a wire bonding pad for wire bonding or as a bump pad for flip chip bonding. In order to be used as a wire bonding pad for wire bonding or a bump pad for flip chip bonding, the pad needs to have a width of at least 40 μm. Thus the width $W_a$ of the protruded circuit pattern 106 is formed to be wider than the width $W_b$ of the embedded circuit pattern 104b, which is used as the signal line.

According to the package substrate 100, a circuit pattern with an embedded structure and a circuit pattern with a protruded structure are realized together on a surface on which an electronic component is to be installed, and thus it is possible to install a flip chip and a wire bonding chip together and to form a fine circuit pattern.

Figure 3:
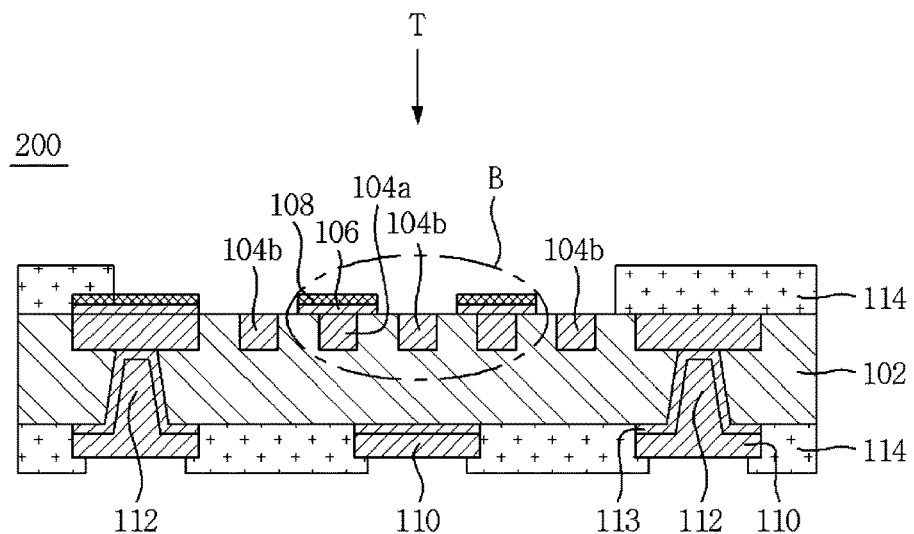
FIG. 3 is a diagram illustrating an example of a package substrate.

FIG. 3 is a diagram illustrating an example of a package substrate.

Referring to FIG. 3, a package substrate 200 is similar to the package substrate 100 illustrated in FIG. 1, except that the package substrate 200 further includes a surface treatment layer 108 formed above the protruded circuit pattern 106. Accordingly, descriptions of elements that are redundant with those of the package substrate 100 illustrated in FIG. 1 will not be provided herein. The above descriptions of FIG. 1, is also applicable to FIG. 2, and is incorporated herein by reference.

The package substrate 200 has the surface treatment layer 108 formed above the protruded circuit pattern 106.

The surface treatment layer 108, which prevents oxidation of a surface of the protruded circuit pattern 106 and improves a soldering property, may be formed using various surface treating methods, such as, for example, by electroplating Ni/Au, Ni/Pd/Au or Tin, or by surface treating organic solderability preservative (OSP).

As illustrated in FIG. 3, since the package substrate 200 includes both the first circuit patterns 104a and 104b embedded in a surface on which an electronic component (not shown) is to be installed and the protruded circuit pattern 106, which protrudes on the surface on which an electronic component (not shown) is to be installed, it is possible that a flip chip and a wire bonding chip are installed together.

Moreover, in the package substrate 200 illustrated in FIG. 3, the embedded first circuit pattern 104b having no protruded circuit pattern formed thereon is used as a signal line and forms a region where fine circuits are concentrated.

Surfaces of the embedded first circuit patterns 104a and 104b are formed on a same plane as a surface of the insulating layer 102. The protruded circuit pattern 106 protrudes above the first circuit pattern 104 that is embedded by about 10 μm or less. Thus, a top surface of the protruded circuit pattern 106 is at a different plane than the plane of a top surface of the insulating layer 102.

As illustrated in FIG. 3, the package substrate 200 has the surface treatment layer 108. In an example, the surface treatment layer 108, electroplated with Ni/Au, is formed above the protruded circuit pattern 106. Although the surface treatment layer 108 is illustrated as a single layer in FIG. 3, in another example, nickel and gold are actually electroplated in double layers.

Figure 4:
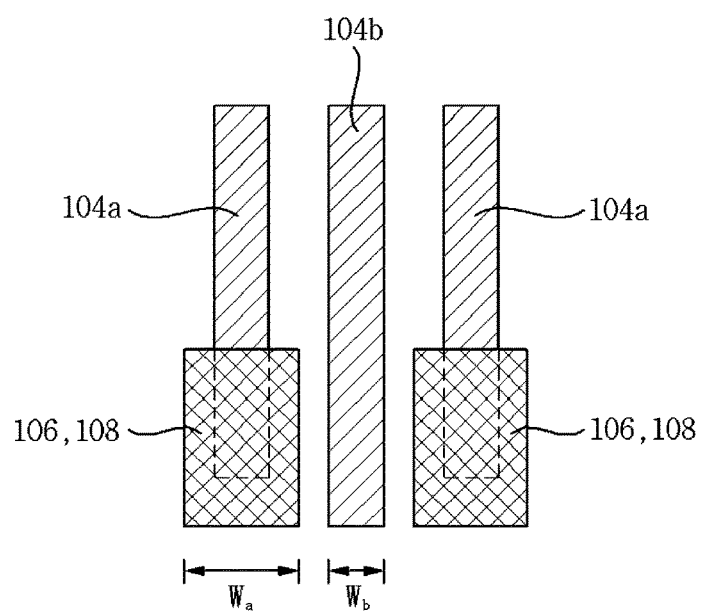
FIG. 4 is a diagram illustrating an example of a section marked "B" of the package substrate shown in FIG. 3 seen from the top (T) in order to compare widths of an embedded circuit pattern and a protruded circuit pattern.

Referring to FIG. 4, a width $W_a$ of the protruded circuit pattern 106 and the surface treatment layer 108 is greater than a width $W_b$ of each of the embedded first circuit patterns 104a, 104b.

The protruded circuit pattern 106 is used as a wire bonding pad for wire bonding or as a bump pad for flip chip bonding. In order to be used as a wire bonding pad for wire bonding or a bump pad for flip chip bonding, the pad needs to have a width of at least 40 μm. Thus the width $W_a$ of the protruded circuit pattern 106 and the surface treatment layer 108 wider than the width $W_b$ of the embedded first circuit pattern 104b, which is used as the signal line.

As described later, where the surface treatment layer 108 is formed above a seed layer. The seed layer having no surface treatment layer 108 formed thereon is removed using the gold-plated surface treatment layer 108 as an etching resist, a lateral surface of the protruded circuit pattern 106 below the surface treatment layer 108 may be etched, decreasing a width of the protruded circuit pattern 106. Therefore, considering this possibility, the width $W_a$ of the protruded circuit pattern 106 is wider than the width $W_b$ of the embedded first circuit pattern 104b.

According to the package substrate 200, a circuit pattern with an embedded structure and a circuit pattern with a protruded structure are realized together on a surface on which an electronic component is to be installed, and thus it is possible to install a flip chip and a wire bonding chip together and to form a fine circuit pattern.

FIG. 5A through FIG. 5G are diagrams illustrating examples of a method of manufacturing a package substrate by illustrating cross-sectional views of the package substrate during the manufacturing process. The operations in FIGS. 5A-5G may be performed in the sequence and manner as shown, although the order of some operations may be changed or some of the operations omitted without departing from the spirit and scope of the illustrative examples described. Many of the operations shown in FIGS. 5A-5G may be performed in parallel or concurrently. The above description of FIGS. 1-4, is also applicable to FIGS. 5A-5G, and is incorporated herein by reference. Thus, the above description may not be repeated here.

Figure 5A:
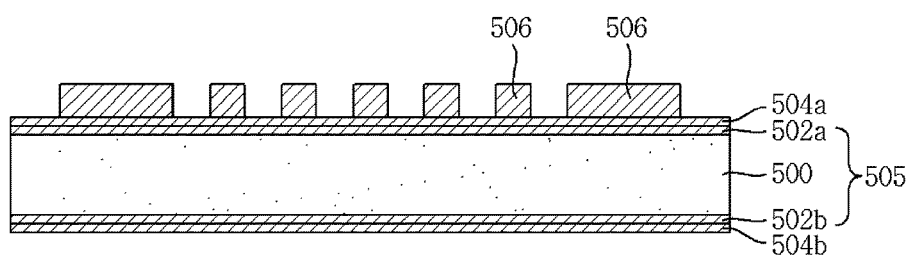
FIG. 5A through FIG. 5G are diagrams illustrating examples of a method of manufacturing a package substrate by illustrating cross-sectional views of the package substrate during the manufacturing process.

As illustrated in FIG. 5A, a carrier substrate 505 having a first seed layer 504a and 504b laminated thereon is prepared, and a first circuit layer 506 is formed on the first seed layer 504a through a circuit-forming process.

The first seed layer 504a and 504b may be made of any circuit-forming conductive metal used in the field of circuit board. For example, the first seed layer 504a and 504b is commonly made of copper.

The carrier substrate 505 is a substrate having copper foil layers 502a and 502b laminated on either surface of an insulating material 500. The first seed layer 504a and the copper foil layer 502a are separable from each other. Likewise, the first seed layer 504b and the copper foil layer 502b are separable from each other.

In the example illustrated in FIG. 5A, the first circuit layer 506 is formed on one surface of the carrier substrate 505. In other examples, the first circuit layer 506 may be formed on both surfaces of the carrier substrate 505.

Figure 5B:
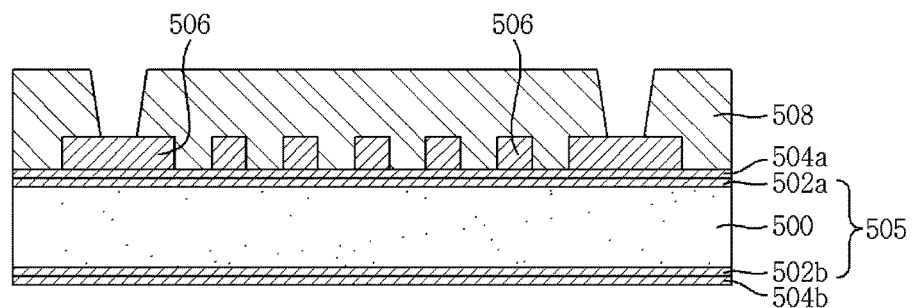

As illustrated in FIG. 5B, an insulating layer 508 is laminated to embed the first circuit layer 506. A portion of the insulating layer 508 is removed to expose a portion of the first circuit layer 506.

Figure 5C:
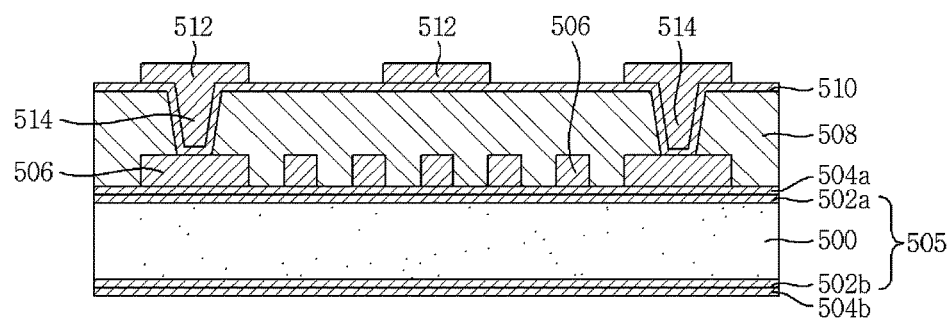

As illustrated in FIG. 5C, a second seed layer 510 is formed on an upper surface of the insulating layer 508 and on the portion of the insulating layer 508 where the first circuit layer 506 is exposed. The second circuit layers 512 and 514, which include a via 514 electrically connected with the portion of the first circuit layer 506, are formed through an electroplating process using the second seed layer 510 as a seed layer for electroplating.

The second seed layer 510, which is formed for electroplating, may be made of any conductive metal, such as, for example, copper.

Figure 5D:
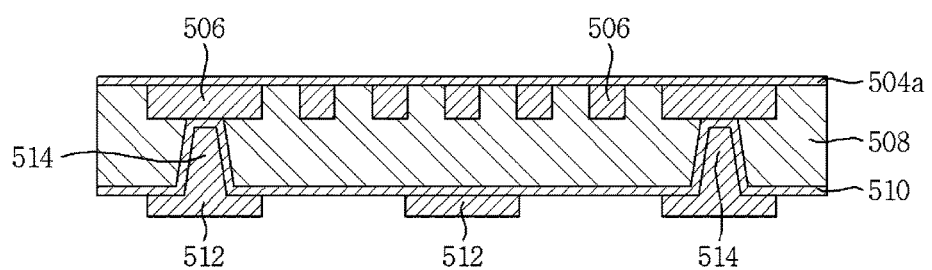

As illustrated in FIG. 5D, an embedded pattern substrate 515 is prepared by separating the first seed layer 504a and the copper foil layer 502a from each other. The embedded pattern substrate 515 illustrated in FIG. 5D is formed by separating the first seed layer 504a and the copper foil layer 502a from each other and inverting the resulting substrate.

Figure 5E:
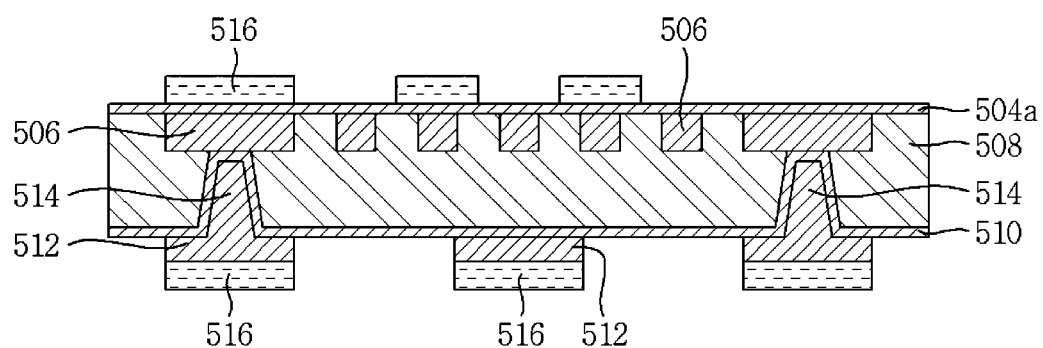

As illustrated in FIG. 5E, an etching resist 516 is formed in order to partially remove the first seed layer 504a and the second seed layer 510.

Figure 5F:
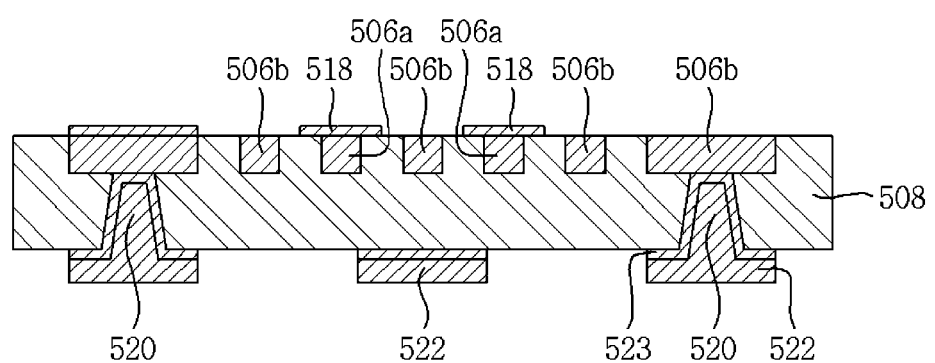

As illustrated in FIG. 5F, etching is carried out and then the etching resist 516 is removed to form first circuit patterns 506a, 506b, a protruded circuit pattern 518 formed above some of the first circuit patterns 506a, 506b, second circuit patterns 522, 523 and a via 520 connecting the first circuit patterns 506a, 506b with the second circuit patterns 522, 523.

Referring to FIG. 5F, a width $W_a$ of the protruded circuit pattern 518 is greater than a width $W_b$ of each of the embedded first circuit patterns 506a and 506b.

The protruded circuit pattern 518 is used as a wire bonding pad for wire bonding or as a bump pad for flip chip bonding. To be used as a wire bonding pad for wire bonding or a bump pad for flip chip bonding, the pad needs to have a width of at least 40 μm. Thus, the protruded circuit pattern 518 is formed to be wider than each of the embedded first circuit patterns 506a, 506b.

Accordingly, when the etching resist 516 is formed in FIG. 5E in order to partially remove the first seed layer 504a and the second seed layer 510, the etching resist 516 is formed such that the width $W_a$ of the protruded circuit pattern 518 is greater than the width $W_b$ of each of the embedded first circuit patterns 506a and 506b.

Figure 5G:
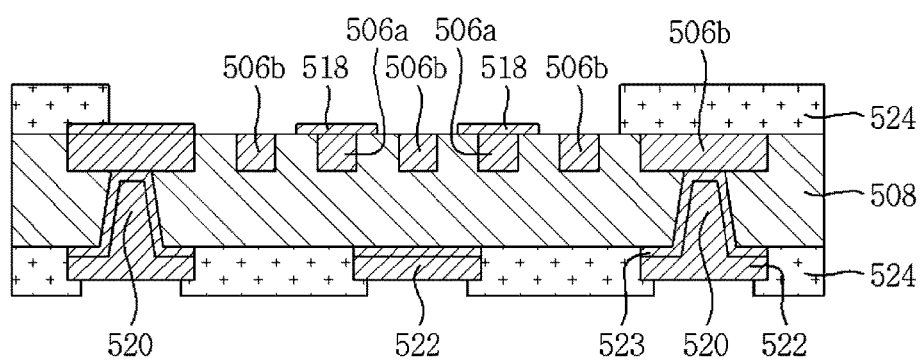

As illustrated in FIG. 5G, a package substrate 530 is formed by forming a solder resist layer 524, through a solder masking process, covering portions of the first circuit patterns 506a and 506b, portions of an upper surface of the insulating layer 508. The solder resist layer 524 also covers portions of the second circuit patterns 522 and 523 and portions of a lower surface of the insulating layer 508.

According to the method of manufacturing a package substrate described above, an embedded structure of circuit pattern and a protruded structure of circuit pattern may be realized together on a surface where an electronic component is to be installed. Thus, it is possible to manufacture a package substrate in which a flip chip and a wire bonding chip may be installed at the same time and fine circuit patterns may be formed.

FIG. 6A through FIG. 6I are diagrams illustrating examples of a method of manufacturing a package substrate by illustrating cross-sectional views of the package substrate during the manufacturing process. The operations in FIGS. 6A-6I may be performed in the sequence and manner as shown, although the order of some operations may be changed or some of the operations omitted without departing from the spirit and scope of the illustrative examples described. Many of the operations shown in FIGS. 6A-6I may be performed in parallel or concurrently. The above description of FIGS. 1-5G, is also applicable to 6A-6I, and is incorporated herein by reference. Thus, the above description may not be repeated here.

The processes described and illustrated herein are based on a 2-layered (2L) embedded trace structure. In the conventional 2L embedded trace structure of package substrate, a carrier substrate is separated, and then seed layers above and below the carrier substrate, respectively, are immediately etched to complete the formation of circuit patterns. However, in the method of manufacturing a package substrate in accordance with the second embodiment, a copper seed layer on the side of an embedded circuit pattern is utilized for tailless electroplating.

Figure 6A:
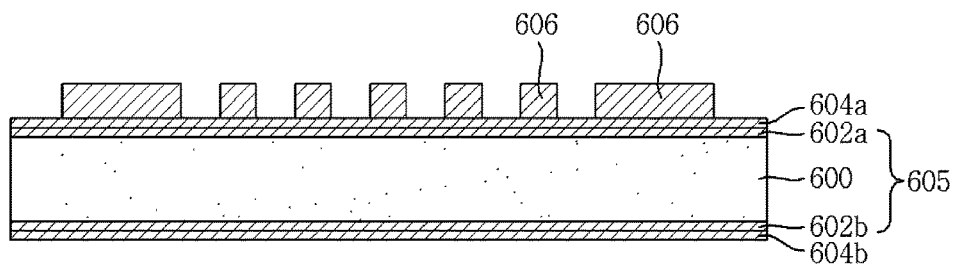
FIG. 6A through FIG. 6I are diagrams illustrating examples of a method of manufacturing a package substrate by illustrating cross-sectional views of the package substrate during the manufacturing process.

As illustrated in FIG. 6A, a carrier substrate 605 having a first seed layer 604a and 604b laminated thereon is prepared. A first circuit layer 606 is formed on the first seed layer 604a through a circuit-forming process.

The carrier substrate 605 is a substrate having copper foil layers 602a and 602b laminated on either surface of an insulating material 600. The first seed layer 604a and the copper foil layer 602a are separable from each other. The first seed layer 604b and the copper foil layer 602b are separable from each other.

Figure 6B:
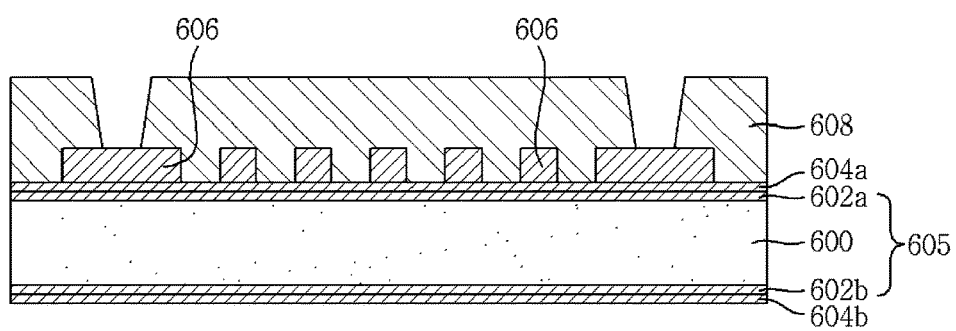

As illustrated in FIG. 6B, an insulating layer 608 is laminated to embed the first circuit layer 606, and a portion of the insulating layer 608 is removed to expose a portion of the first circuit layer 606.

Figure 6C:
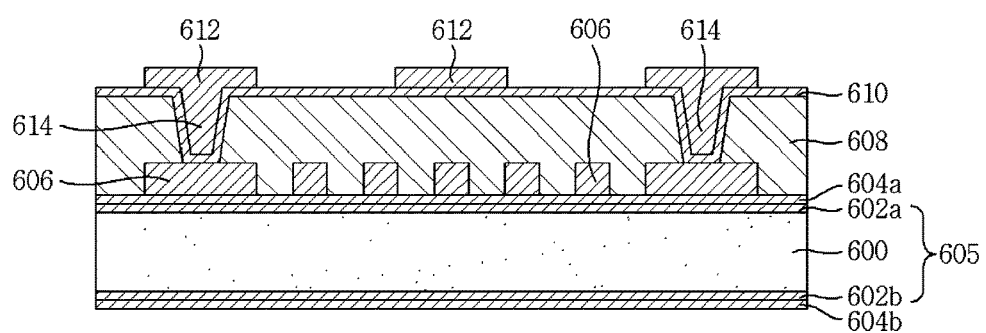

As illustrated in FIG. 6C, a second seed layer 610 is formed on an upper surface of the insulating layer 608 and on the portion of the insulating layer 608 where the first circuit layer 606 is exposed. The second circuit layers 612 and 614, which include a via 614 electrically connected with the portion of the first circuit layer 606, are formed through an electroplating process using the second seed layer 610 as a seed layer for electroplating.

Figure 6D:
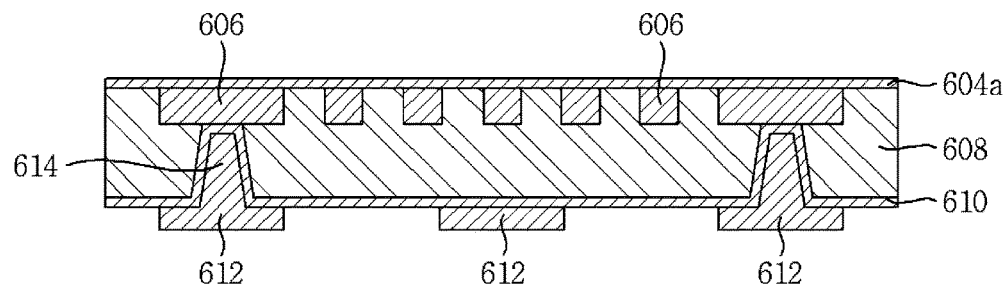

As illustrated in FIG. 6D, an embedded pattern substrate 615 is prepared by separating the first seed layer 604a and the copper foil layer 602a from each other. The embedded pattern substrate 615 illustrated in FIG. 6D is formed by separating the first seed layer 604a and the copper foil layer 602a from each other and inverting the resulting substrate.

Figure 6E:
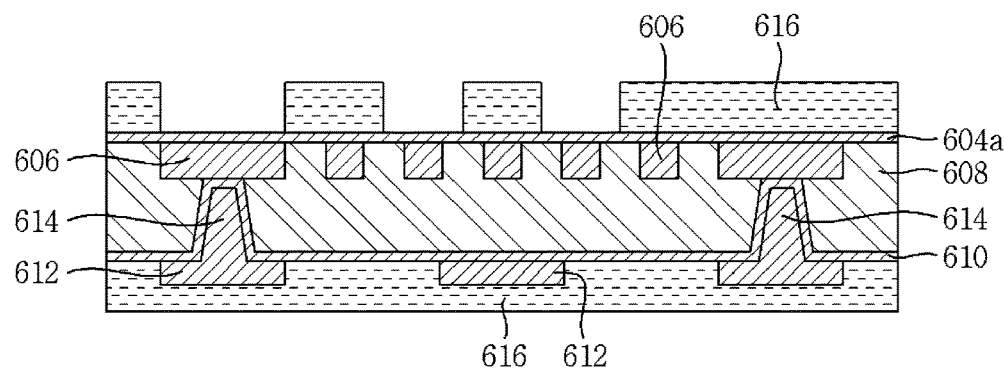

As illustrated in FIG. 6E, a masking process is carried out using a plating resist 616, such as a dry film, such that portions of a surface of the first seed layer 604a that need to be surface-treated are exposed. The bottom surface of the embedded pattern substrate 615 is masked for OSP ball pad.

Figure 6F:
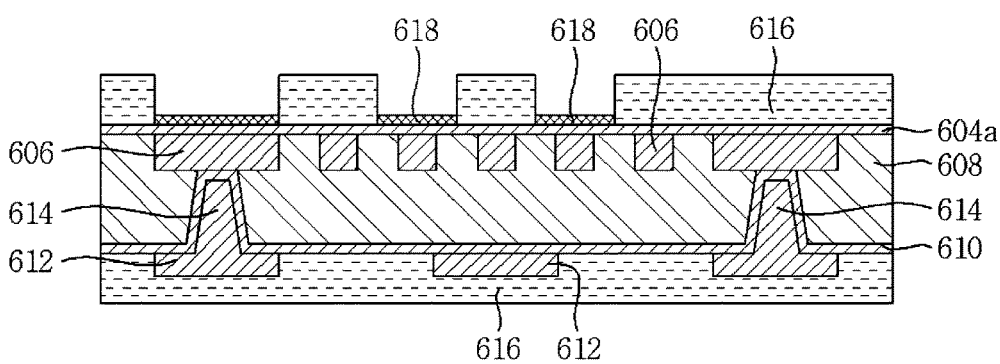

As illustrated in FIG. 6F, a surface treatment layer 618 is formed on the exposed surface of the first seed layer 604a by performing an electroplating process using the first seed layer 604a as a seed layer for electroplating. The surface treatment layer 618 may be formed using various surface treating methods, for example, by electroplating Ni/Au, Ni/Pd/Au or Tin.

The first circuit layer 606 and the second circuit layers 612 and 614 are connected by the first seed layer 604a and the second seed layer 610, respectively. The first seed layer 604a and the second seed layer 610 are made of copper, and desired portions of the embedded pattern substrate 615 may be electroplated through the first seed layer 604a and the second seed layer 610. Accordingly, the surface treatment layer 618 may be formed at desired portions of the embedded pattern substrate 615. The plated portions are portions that are not covered by the plating resist 616 before plating, i.e., as shown in FIG. 6E.

Figure 6G:
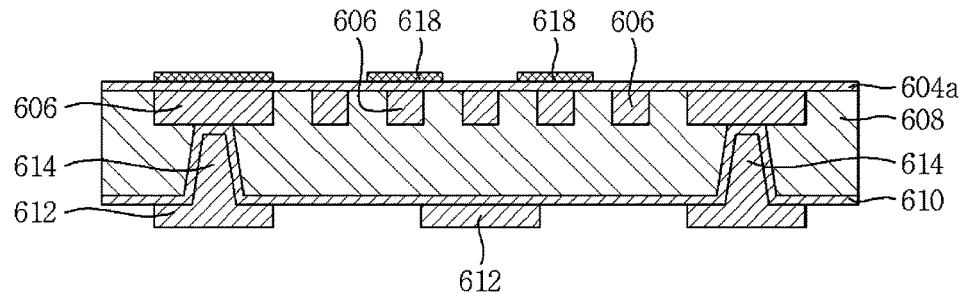

As illustrated in FIG. 6G, the plating resist 616 is removed entirely.

Figure 6H:
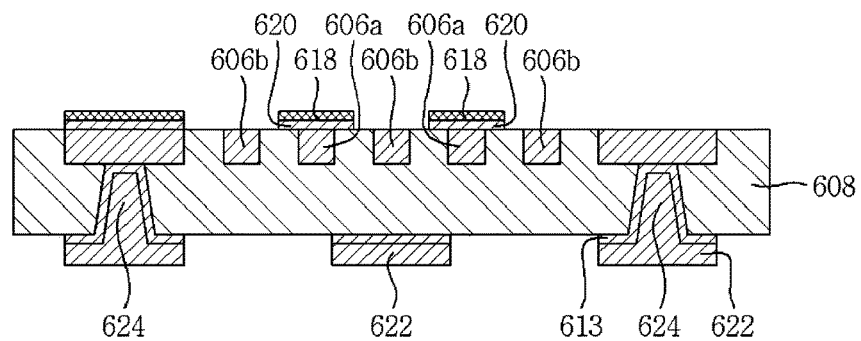

As illustrated in FIG. 6H, the portions of the first seed layer 604a where the surface treatment layer 618 is not formed are removed to form first circuit patterns 606a and 606b, which are embedded in the insulating layer 608. A protruded circuit pattern 620 is formed above some of the first circuit patterns 606a. Second circuit patterns 613, 622, and 624 are formed by removing portions of the second seed layer 610. Surfaces of the embedded first circuit patterns 606a are 606b are formed on a same plane as the upper surface of the insulating layer 608.

The protruded circuit pattern 620 is used as a wire bonding pad for wire bonding or as a bump pad for flip chip bonding. To be used as a wire bonding pad for wire bonding or a bump pad for flip chip bonding, the pad needs to have a width of at least 40 μm. Thus, the protruded circuit pattern 620 and the surface treatment layer 618 are formed to be wider than each of the embedded first circuit patterns 606a and 606b.

Referring to FIG. 6H, in an example, the surface treatment layer 618 is formed with a Ni/Au plated layer. Since gold (Au) is not removed by an etchant and can function as an etching resist, the portions of the first seed layer 604a where the surface treatment layer 618 is not formed are removed using the gold-made surface treatment layer 618 as the etching resist.

When the surface treatment layer 608 is used as the etching resist, a lateral surface of the protruded circuit pattern 620 below the surface treatment layer 608 may be etched, decreasing a width of the protruded circuit pattern 620. Therefore, the protruded circuit pattern 620 is formed to be wider than the embedded first circuit patterns 606a, 606b.

When the surface treatment layer 618 is not formed with a gold-plated layer, the portions of the first seed layer 604a where the surface treatment layer 618 is not formed may be removed after forming an additional etching resist.

Figure 6I:
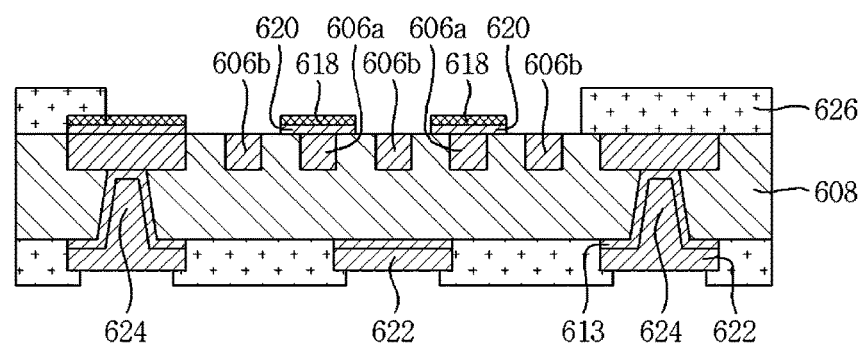

As illustrated in FIG. 6I, a package substrate 630 is formed by forming a solder resist layer 626, through a solder masking process, covering portions of the first circuit patterns 606a, 606b and portions of an upper surface of the insulating layer 608 and covering portions of the second circuit patterns 613, 622, 624 and portions of a lower surface of the insulating layer 608.

According to a method of manufacturing a package substrate, an embedded structure of circuit pattern and a protruded structure of circuit pattern may be realized together on a surface where an electronic component is to be installed. Thus, it is possible to manufacture a package substrate in which a flip chip and a wire bonding chip may be installed at the same time and fine circuit patterns may be formed.

Moreover, according to a method of manufacturing a package substrate, the first seed layer 604a used for forming the embedded first circuit patterns 606a and 606b is utilized to form the surface treatment layer 618 above the protruded circuit pattern 620, which needs to be surface-treated. This is done without forming an additional seed layer for electroplating or an additional plating lead-in wire, and thus, the processes used for the method of manufacturing a package substrate may be simpler and more economical than the conventional tailless method.

According to a package substrate and a method of manufacturing a package substrate, the structure of an embedded circuit pattern may be used to realize a fine circuit having an L/S (line/space; i.e., width/space of a circuit pattern) of 20/20 μm or less, and surface treatment may be carried out, without an additional plating lead-in wire, at desired portions without adding the tailless method.

Moreover, according to a package substrate and a method of manufacturing a package substrate, an embedded structure of circuit pattern and a protruded structure of circuit pattern may be realized together on a surface where an electronic component is to be installed, and thus the package substrate and the method of manufacturing a package substrate may be readily utilized for the heavily tailless design required wire bonding products or hybrid flip chip products, in which flip chips and wire bonding chips are installed together.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A package substrate, comprising:
   an insulating layer having first circuit patterns embedded in a first surface of the insulating layer;
   a protruded circuit pattern formed above at least one of the embedded first circuit patterns; and
   a solder resist layer in a pattern that covers a portion of the first circuit patterns and a portion of the first surface of the insulating layer, and exposes a portion of the first circuit patterns and a portion of the first surface of the insulating layer,
   wherein a width of the protruded circuit pattern is greater than a width of the at least one of the embedded first circuit patterns,
   wherein a depth of the at least one of the embedded first circuit patterns is less than a depth of the insulating layer, and
   wherein lateral surfaces of the protruded circuit pattern are separated from the solder resist layer.

2. The package substrate of claim 1, further comprising a surface treatment layer formed above the protruded circuit pattern.

3. The package substrate of claim 2, wherein a surface of the surface treatment layer comprises a first layer electroplated on a second layer.

4. The package substrate of claim 1, wherein a surface of the each of the embedded first circuit patterns is formed on a same plane as the first surface of the insulating layer.

5. The package substrate of claim 1, further comprising a second circuit patter formed on a second surface of the insulating layer.

6. The package substrate of claim 5, further comprising a via to electrically connect the first circuit patterns with the second circuit pattern.

7. The package substrate of claim 6, wherein the solder resist layer covers a portion of the first circuit patterns, a portion of the first surface of the insulating layer, a portion of the second circuit patter, and a portion of the second surface of the insulating layer.

8. The package substrate of claim 5, wherein the second surface of the insulating layer is disposed parallel and opposite to the first surface of the insulating layer.

9. The package substrate of claim 1, wherein a surface of the protruded circuit pattern is disposed parallel to and above the first surface.

10. The package substrate of claim 1, wherein a width of the protruded circuit patter is greater than twice as large as a width of the at least one of the embedded first circuit patterns.

* * * * *